US007216009B2

(12) United States Patent
Farnworth et al.

(10) Patent No.: US 7,216,009 B2
(45) Date of Patent: May 8, 2007

(54) MACHINE VISION SYSTEMS FOR USE WITH PROGRAMMABLE MATERIAL CONSOLIDATION SYSTEM AND ASSOCIATED METHODS AND STRUCTURES

(75) Inventors: Warren M. Farnworth, Nampa, ID (US); Alan G. Wood, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/867,258

(22) Filed: Jun. 14, 2004

(65) Prior Publication Data

US 2005/0278056 A1    Dec. 15, 2005

(51) Int. Cl.
*G06F 19/00*    (2006.01)
(52) U.S. Cl. ............ 700/123; 700/118; 257/678; 438/674
(58) Field of Classification Search ........... 700/96, 700/121, 258, 259, 118, 123, 124; 438/7, 438/674, 942; 264/401
See application file for complete search history.

(56) References Cited

U.S. PATENT DOCUMENTS

| 4,526,646 A | 7/1985 | Suzuki et al. |
| 4,543,659 A | 9/1985 | Ozaki |
| 4,736,437 A | 4/1988 | Sacks et al. |
| 4,899,921 A | 2/1990 | Bendat et al. |
| 5,059,559 A | 10/1991 | Takahashi et al. |
| 5,113,565 A | 5/1992 | Cipolla et al. |
| 5,143,663 A | 9/1992 | Leyen et al. |
| 5,145,099 A | 9/1992 | Wood et al. |
| 5,174,943 A | 12/1992 | Hull |
| 5,238,174 A | 8/1993 | Ricketson et al. |
| 5,287,435 A | 2/1994 | Cohen et al. |
| 5,288,698 A | 2/1994 | Banjo et al. |
| 5,460,758 A | 10/1995 | Langer et al. |
| 5,463,227 A | 10/1995 | Stem et al. |
| 5,471,310 A | 11/1995 | Spigarelli et al. |

(Continued)

FOREIGN PATENT DOCUMENTS

DE    19952998    5/2001

(Continued)

OTHER PUBLICATIONS

Photopolymer Materials and Support Resins; Object FullCure 700 Series; 2 pages.

(Continued)

*Primary Examiner*—Leo Picard
*Assistant Examiner*—Sheela S. Rao
(74) *Attorney, Agent, or Firm*—TraskBritt

(57) ABSTRACT

Programmable material consolidation systems employing a machine vision system in combination with a 3-D printing system for accurately locating a position over a support element and optionally on a substrate on the support element, and forming structural features thereon. By use of the machine vision system, the precise location on a substrate or support element may be determined and communicated to the dispense element of the 3-D printing system such that a flowable material may be deposited and consolidated at a desired location to form a structural feature. Methods for forming various features and structures on a substrate employing the systems of the present invention are also disclosed.

34 Claims, 7 Drawing Sheets

U.S. PATENT DOCUMENTS

| | | | |
|---|---|---|---|
| 5,482,659 A | 1/1996 | Sauerhoefer | |
| 5,506,684 A | 4/1996 | Ota et al. | |
| 5,508,489 A | 4/1996 | Benda et al. | |
| 5,516,023 A | 5/1996 | Kono | |
| 5,516,026 A | 5/1996 | Ariye et al. | |
| 5,573,721 A | 11/1996 | Gillette | |
| 5,622,811 A | 4/1997 | Ogue et al. | |
| 5,644,245 A | 7/1997 | Saitoh et al. | |
| 5,985,357 A * | 11/1999 | Sanada | 427/8 |
| 6,021,358 A | 2/2000 | Sachs | |
| 6,158,346 A | 12/2000 | Zhang | |
| 6,162,378 A | 12/2000 | Bedal et al. | |
| 6,251,488 B1 | 6/2001 | Miller et al. | |
| 6,259,962 B1 | 7/2001 | Gothait | |
| 6,268,584 B1 | 7/2001 | Keicher et al. | |
| 6,337,122 B1 | 1/2002 | Grigg et al. | |
| 6,391,251 B1 | 5/2002 | Keicher et al. | |
| 6,483,596 B1 | 11/2002 | Philippi et al. | |
| 6,508,971 B2 | 1/2003 | Leyden et al. | |
| 6,537,482 B1 | 3/2003 | Farnworth | |
| 6,547,994 B1 | 4/2003 | Monkhouse et al. | |
| 6,569,373 B2 | 5/2003 | Napadensky | |
| 6,610,429 B2 | 8/2003 | Bredt et al. | |
| 6,630,995 B1 * | 10/2003 | Hunter | 356/237.5 |
| 6,644,763 B1 | 11/2003 | Gothait | |
| 6,656,409 B1 | 12/2003 | Keicher et al. | |
| 6,658,314 B1 | 12/2003 | Gothait | |
| 6,660,209 B2 | 12/2003 | Leyden et al. | |
| 6,680,078 B2 * | 1/2004 | Davlin et al. | 427/8 |
| 6,736,900 B2 * | 5/2004 | Isogai et al. | 118/663 |
| 2002/0090410 A1 | 7/2002 | Tochimoto et al. | |
| 2002/0171177 A1 | 11/2002 | Kritchman et al. | |
| 2003/0151167 A1 | 8/2003 | Kritchman et al. | |
| 2003/0173713 A1 | 9/2003 | Huang | |
| 2003/0207959 A1 | 11/2003 | Napadensky et al. | |
| 2004/0153193 A1 | 8/2004 | Farnworth | |
| 2004/0159340 A1 | 8/2004 | Hiatt et al. | |
| 2004/0159344 A1 | 8/2004 | Hiatt et al. | |
| 2004/0164461 A1 | 8/2004 | Ahmad et al. | |
| 2004/0167663 A1 | 8/2004 | Hiatt et al. | |
| 2004/0251242 A1 | 12/2004 | Suh | |

FOREIGN PATENT DOCUMENTS

| | | |
|---|---|---|
| JP | 56151516 | 11/1981 |
| JP | 08150662 | 6/1996 |
| JP | 2000263603 | 9/2000 |
| WO | WO 97/17664 | 5/1997 |

OTHER PUBLICATIONS

"Welcome to the 2$^{nd}$ Generation PolyJet"; PolyJet 2$^{nd}$ Generation Technology; 4 pages.

U.S. Appl. No. 10/705,249, filed Nov. 10, 2003, entitled "Methods for Recognizing Features as One or More Objects are Being Fabricated by Programmed Material Consolidation Techniques", inventor Farnworth.

U.S. Appl. No. 10/705,409, filed Nov. 10, 2003, entitled "Substrate Supports for use with Programmable Material Consolidation Apparatus and Systems", inventor Hiatt et al.

U.S. Appl. No. 10/705,726, filed Nov. 10, 2003, entitled "Bubble Elimination System for use with Stereolithography Apparatus and Bubble Elimination Methods", inventor Farnworth.

U.S. Appl. No. 10/705,727, filed Nov. 10, 2003, entitled "Machine Vision Systems for use with Programmable Material Consolidation Apparatus and Systems", inventor Farnworth.

U.S. Appl. No. 10/705,728, filed Nov. 10, 2003, entitled "Methods for Supporting Substrates During Fabrication of One or More Objects Thereon by Programmable Material Consolidation Techniques", inventor Hiatt et al.

European Search Report dated Aug. 17, 2005 (5 pages).

* cited by examiner

MACHINE VISION SYSTEMS FOR USE WITH PROGRAMMABLE MATERIAL CONSOLIDATION SYSTEM AND ASSOCIATED METHODS AND STRUCTURES

BACKGROUND OF THE INVENTION

1. Field of the Invention

The present invention relates to systems and methods of three-dimensional (3-D) printing. More specifically, the present invention relates to systems and methods of 3-D printing for fabricating features on semiconductor devices and related components.

2. State of the Art

Over the past few years three-dimensional (3-D) printing has evolved into a relatively promising process for building parts. For example, 3-D printing has been used for the production of prototype parts and tooling directly from a computer-aided design (CAD) model.

Three-dimensional printing of solid structures utilizes a computer, typically under control of computer-aided design (CAD) software, to generate a 3-D mathematical model of an object to be fabricated. The computer mathematically separates, or "slices," the model into a large number of relatively thin, parallel, usually vertically superimposed layers. Each layer has defined boundaries and other features that correspond to a substantially planar section of the model and, thus, of the actual object to be fabricated. A complete assembly or stack of all of the layers defines the entire model. A model which has been manipulated in this manner is typically stored and, thus, embodied as a CAD computer file. The model is then employed to fabricate an actual, physical object by building the object, layer by superimposed layer.

One particularly effective 3-D printing system, commercially available from Objet Geometries Ltd. of Rehovot, Israel, is the Eden 330®. In operation, the Eden 330® deposits a layer of photopolymer material via inkjet type of printer heads onto a support. For example, layers as thin as 16 μm at a 600×300 dpi (dot per inch) resolution may be deposited in a selected location using the printer heads currently available. After each deposition of the layer of photopolymer, an ultraviolet (UV) light is used to cure and harden each layer. The process is repeated by selectively depositing additional photopolymer to form an additional layer, followed by subsequent curing until the complete 3-D CAD model is formed. Other 3-D printing systems and methods are described in detail in U.S. Pat. Nos. 6,658,314; 6,644,763; 6,569,373; and 6,259,962 assigned to Objet Geometries Ltd., the disclosure of each of which patents is hereby incorporated herein in its entirety by this reference.

Conventionally, 3-D printing systems, such as the aforementioned Objet systems, have been used to fabricate freestanding structures. Such structures have been formed directly on a platen or other support system of the 3-D printing system. Complicated geometries having overhangs and undercuts may be formed by employing a support material, which the structure is formed on, followed by removing the support material by dissolving the support material in water. As the freestanding structures are fabricated directly on the support system and have no physical relationship to other structures at the time they are formed, there is typically no need to precisely and accurately position features of the fabricated structure. Accordingly, conventional 3-D printing systems lack image sensors for ensuring that structures are fabricated at specific, desired locations. However, precise and accurate positioning of features of structures fabricated using a 3-D printing system would be particularly important if the structures were to be 3-D printed, on or immediately adjacent to, another object, such as a semiconductor device, an assembly including a semiconductor device and other components, or an assembly incorporating one or more semiconductor devices carried, for example, on a carrier substrate such as a printed circuit board.

Stereolithography has been used in the past to form a variety of features on semiconductor assemblies, such as underfill and encapsulation structures. The stereolithography techniques employed typically involve immersing the semiconductor assembly to a predetermined depth in a liquid photopolymerizable resin and selectively curing portions of the liquid resin by rastering with a laser beam to form the desired structures. Examples of stereolithography systems suitable for forming a variety of features on a semiconductor assembly are disclosed in U.S. Pat. No. 6,537,482 to Farnworth and U.S. patent application Ser. No. 10/705,727 to Farnworth, both of which are assigned to the assignee of the present application. The disclosure of each of the foregoing documents is hereby incorporated herein in its entirety by this reference.

While the above-referenced Farnworth patent and patent application disclose forming a variety of different structures on a semiconductor assembly, the disclosed immersion-type stereolithography processes require the use of an excess amount of expensive photopolymer material. This is because only a portion of the liquid photopolymerizable resin is cured to form a structural element while the remaining liquid resin must be drained and cleaned from the semiconductor assembly. Furthermore, the processing time using immersion-type stereolithography systems is significantly slower than the processing time for a 3-D printing system, such as the aforementioned Objet systems.

Accordingly, there is a need for 3-D printing systems which are configured to form structures on substrates, such as semiconductor substrates and semiconductor device components, and which include systems for accurately positioning the fabricated structures during formation thereof.

BRIEF SUMMARY OF THE INVENTION

The present invention, in a number of embodiments, includes programmable material consolidation systems for precisely fabricating 3-D structures on a substrate. In addition, the present invention includes methods that employ the systems of the present invention and the resulting structures formed by such methods.

One aspect of the present invention encompasses programmable material consolidation systems for fabricating objects. The systems include at least one dispense element that operates under the control of at least one controller, a dispense element positioner for effecting movement of the dispense element, and a machine vision system. The dispense element may be configured for selectively depositing a variety of different types of flowable materials for forming the objects on or over a substrate. The at least one controller may "read" data from a CAD file containing the geometric configuration of the object to be formed and control the operation of the dispense element. A consolidator, under control of the at least one controller, may be employed for at least partially consolidating the deposited flowable material.

The machine vision system of the present invention enables the precise deposition of flowable material in a desired location on or over the substrate. The machine vision system includes an optical detection element, such as a camera, as well as a controller or processing element, such as a computer processor or a collection of computer processors, associated with the optical detection element. The optical detection element may be positioned in a fixed location relative to the substrate, mounted on the dispense element, enabling movement thereof over a substantial portion of the substrate, or moveable independently of the dispense element over a substantial portion of the substrate. The optical detection element of the machine vision system is useful for identifying the locations of recognizable features, including, without limitation, features on a substrate and features, such as fiducial marks or other objects at a fabrication site, and features that have been formed on or over the substrate or at the fabrication site.

Another aspect of the present invention encompasses a semiconductor package for packaging an array of optically interactive semiconductor devices. An array of optically interactive semiconductor devices on a semiconductor substrate may be surrounded by a support structure formed from a consolidated material such as, for example, a cured photopolymer material. The support structure may support at least one lens for focusing light onto the array of optically interactive semiconductor devices and an infrared (IR) filter for filtering IR wavelength light incident on the array. Methods are also disclosed employing programmable material consolidation systems of the present invention to form the support structures from consolidatable materials.

Another aspect of the present invention encompasses a method of forming readily removable mask elements on a substrate employing the programmable material consolidation system of the present invention and the resulting mask element structures. A substrate is provided upon which mask elements will be formed. A flowable consolidatable sacrificial material, such as a water soluble photopolymer, may be dispensed from at least one dispense element of the system in a predetermined location on the substrate. The flowable consolidatable sacrificial material is at least partially consolidated to form at least one mask element. A flowable consolidatable material, such as a liquid photopolymerizable resin, may be applied to the substrate including the mask element followed by at least partially consolidating the flowable consolidatable material to form a structure that substantially surrounds the at least one mask element along its periphery with the mask element exposed therethrough. The at least one mask element may then be removed by exposing the at least one mask element to a solvent to selectively dissolve the mask element without substantially removing the subsequently formed structure. For example, by removing the mask elements, apertures may be formed in a dielectric layer providing access to redistribution lines of a semiconductor device.

These features, advantages, and alternative aspects of the present invention will be apparent to those skilled in the art from a consideration of the following detailed description taken in combination with the accompanying drawings. In the detailed description which follows, like features and elements in the several embodiments are identified in the drawings with the same or similar reference numerals for the convenience of the reader.

BRIEF DESCRIPTION OF THE SEVERAL VIEWS OF THE DRAWINGS

In the drawings, which illustrate what is currently considered to be the best mode for carrying out the invention.

DETAILED DESCRIPTION OF THE INVENTION

Figure 1:
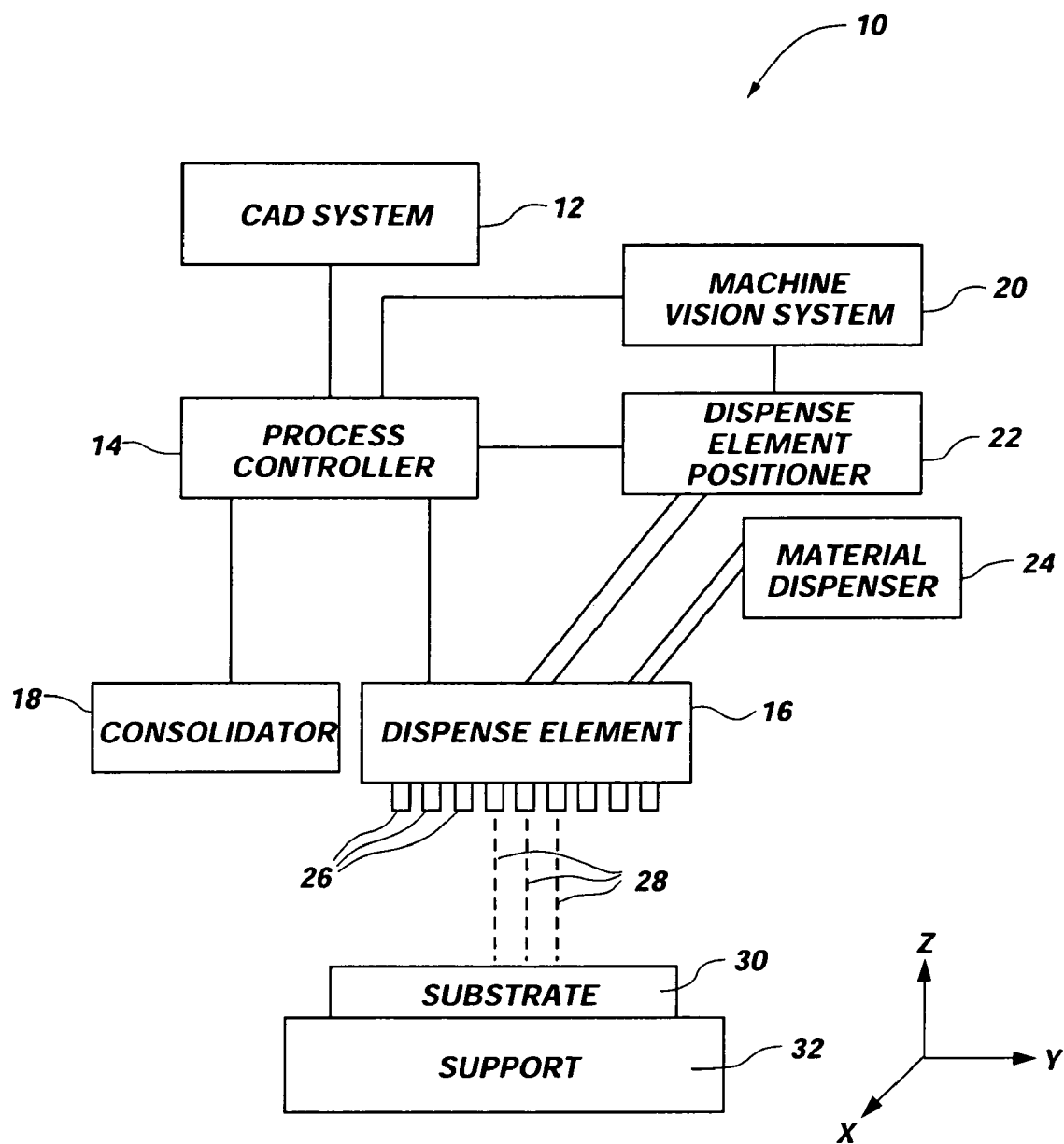
FIG. 1 is a block diagram of an exemplary programmable material consolidation system of the present invention.

FIG. 1 illustrates a block diagram of an exemplary programmable material consolidation system 10 for 3-D printing objects that employs a machine vision system 20 enabling the accurate deposition of flowable material 28 for forming a variety of different structures. One suitable programmable material consolidation system 10 is the commercially available Eden 330® manufactured by Objet Geometries Ltd. of Rehovot, Israel, that is modified to include a machine vision system 20 in accordance with the present invention. Suitable programmable material consolidation systems and processes designed by Objet Geometries Ltd. are described in the aforementioned U.S. Pat. Nos. 6,658, 314; 6,644,763; 6,569,373; and 6,259,962. Of course, teachings of the present invention are also applicable to other kinds of deposition type programmable material consolidation systems such as those commercially available from Optomec Design Company of Albuquerque, N. Mex. and described in U.S. Pat. Nos. 6,251,488; 6,268,584; 6,391, 251; and 6,656,409, the disclosure of each of which patents is hereby incorporated herein in its entirety by this reference.

Referring to FIG. 1, programmable material consolidation system 10 includes a CAD system 12 that includes a CAD computer file stored in memory (e.g., random-access memory (RAM)). The CAD computer file, typically in .stl file format or other suitable file format, contains the geometric configuration of the structure to be formed. The CAD system 12, which may be a desktop computer, is operably coupled to a process controller 14. The process controller 14 may be associated with the CAD system 12 or may be an additional computer or a computer processor, which may be programmed to effect a single function or a number of different functions. Each process controller 14 may be associated with a single programmable material consolidation system 10 or a plurality of systems to coordinate the operation of such systems relative to each other. The process controller 14 is operably coupled to a dispense element 16, a dispense element positioner 22, a consolidator 18, and a machine vision system 20.

With continued reference to FIG. 1, the dispense element 16 may include a plurality of nozzles 26 configured to selectively deposit flowable material 28 in a precise, predetermined amount. For example, current Objet nozzle technology enables forming layers as thin as 16 µm at 600×300 dpi as deposited on a substrate 30. As used herein, the term "dispense element" includes any structure configured to dispense material in a directed manner. The material dispenser 24 dispenses the flowable material 28 to the dispense element 16. The material dispenser 24 is a receptacle or similar apparatus for holding and enclosing the flowable material 28 from being prematurely consolidated or otherwise receiving contaminants. The material dispenser 24 may be contained within the dispense element 16 or may be located outside the dispense element 16 and configured to communicate the flowable material 28 to the dispense element 16. The programmable material consolidation system 10 of the present invention may employ a plurality of material dispensers 24, wherein each respective material dispenser 24 contains a different flowable material 28. The nozzles 26 may be configured and tuned to deposit various types of flowable materials 28. The dispense element 16 may also be configured so that individual nozzles of the plurality of nozzles 26 may deposit different types of flowable materials 28 upon receiving instructions from the process controller 14.

Suitable flowable materials 28 for use with the aforementioned Objet systems include photopolymers, such as DI 7090 Clear Coat manufactured by Marabuwerke Gmbh & Co. of Tamm, Germany. Additional suitable flowable materials include ACCURA® SI 40 Hc AND ACCURA® SI 40 Nd materials available from 3D Systems, Inc., of Valencia, Calif. Other suitable types of flowable material 28 include particulate filled photopolymers having a plurality of discrete particles formed from elemental metals, alloys, ceramics, or mixtures thereof. Thus, various photopolymers may be employed for the flowable material 28 having tailorable physical and mechanical properties. Preferably, the photopolymers are ultraviolet (UV) or infrared (IR) curable materials. Other suitable flowable materials 28 may include powdered metals, ceramics, and mixtures thereof. As used herein, the term "flowable material" means a material suitable for dispensing or projecting in a stream or other unconsolidated mass. One example of a flowable material is a fluid in the form of a gas, a liquid, or viscous liquid which may optionally contain a plurality of particles dispersed therethrough. Another example of a flowable material is a plurality of particles that are finely divided, such as a powdered material, so as to be able to flow as a stream or other unconsolidated mass of material at least until the particles are substantially consolidated. The consolidator 18, which may be an IR or UV light source, may be used to fully cure or at least partially cure, to at least a semisolid state, the deposited flowable material 28. The consolidator 18 may also be a radiation source, such as a laser, suitable for consolidating powdered materials dispensed from dispense element 16 (e.g., powdered metals/alloys, ceramics, or mixtures thereof).

The dispense element 16 may be operably coupled to a dispense element positioner 22 that may include a stepper motor or a driver for the accurate positioning of the dispense element 16 and associated nozzles 26 over a desired location on a substrate 30 supported by a support 32. The dispense element positioner 22 may effect movement of the dispense element 16 in an X and Y direction in the plane of the support 32 and a Z direction substantially perpendicular to the plane of support 32. The types of substrates 30 that support 32 may be configured to carry may include, without limitation, a bulk semiconductor substrate (e.g., a full or partial wafer of semiconductor material, such as silicon, gallium arsenide, indium phosphide, a silicon-on-insulator (SOI) type substrate, such as silicon-on-ceramic (SOC), silicon-on-glass (SOG), or silicon-on-sapphire (SOS), etc.) that includes a plurality of semiconductor devices thereon, printed circuit boards (PCBs), singulated semiconductor dice, singulated semiconductor dice in process assembled with one or more additional components, chip scale and larger semiconductor device assemblies, and associated electronic components.

Figure 2A:
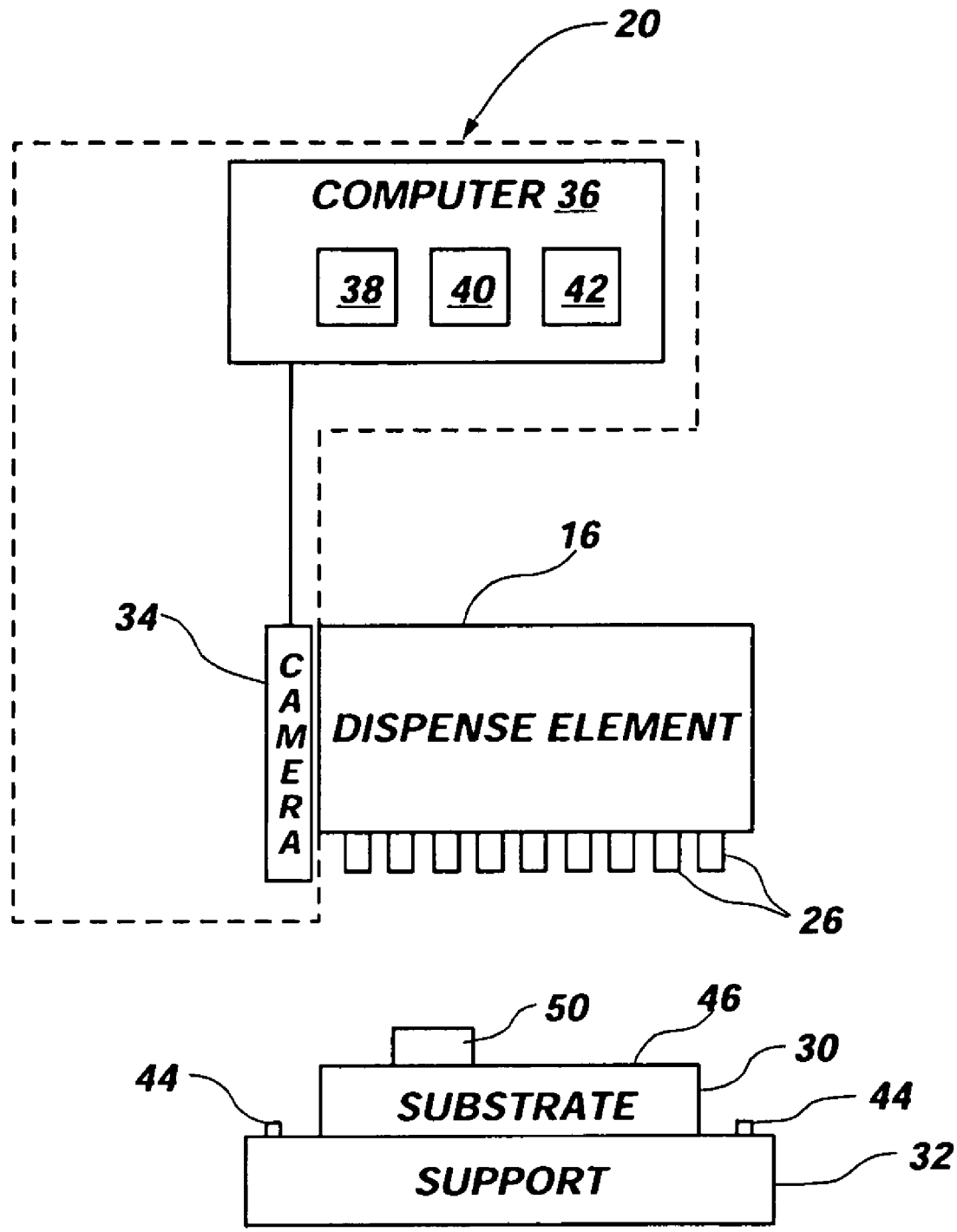
FIG. 2A is a schematic of an exemplary machine vision system utilized in conjunction with the programmable material consolidation system of FIG. 1.

The programmable material consolidation system 10 of the present invention includes a machine vision system 20. Referring to FIG. 2A, the machine vision system 20 includes a camera 34 and a computer 36 having a motherboard 38, a processor 40 and associated memory 42. In FIG. 2A, an exemplary embodiment of machine vision system 20 is depicted, wherein the camera 34 moves with the dispense element 16 such that the camera 34 may be controllably moved over the entire surface 46 of the substrate 30. For example, the camera 34 may be fixed or mounted to the dispense element 16. Dispense element 16, under control of the computer 36, positions camera 34 in close proximity to (e.g., inches from) surface 46 of the substrate 30 and to volume 50 of uncured flowable material 28 so as to enable camera 34 to view minute features on the substrate 30 (e.g., bond pads, conductive traces, fuses, or other circuit elements of a semiconductor device) that are located at or near surface 46. Upon viewing substrate 30, camera 34 communicates information about the precise locations of such features (e.g., with an accuracy of up to about ±0.1 mil (i.e., 0.0001 inch)) to computer 36 of machine vision system 20.

A response by computer 36 may be in the form of instructions regarding the operation of the programmable material consolidation system 10. These instructions may be embodied as signals, or carrier waves. By way of example only, such responsive instructions may be communicated to the process controller 14 of programmable material consolidation system 10. Process controller 14 may, in turn, cause the programmable material consolidation system 10 to operate in such a way as to effect the fabrication of one or more objects on substrate 30 precisely at the intended locations thereof.

Camera 34 may comprise any one of a number of commercially available cameras, such as charge-coupled device (CCD) cameras or complementary metal-oxide-semiconductor (CMOS) cameras available from a number of vendors. Of course, the image resolution of camera 34 should be sufficiently high as to enable camera 34 to view the desired features of substrate 30 and, thus, to enable computer 36 to precisely determine the positions of such features. In order to provide one or more reference points for the features that are viewed by camera 34, camera 34 may also "view" one or more fiducial marks 44 on the support 32.

Suitable electronic componentry, as required for adapting or converting the signals, or carrier waves, that are output by camera 34, may be incorporated on motherboard 38 installed in a computer 36. Such electronic componentry may include one or more processors 40, other groups of logic circuits, or other processing or control elements that have been dedicated for use in conjunction with camera 34. At least one processing element, which may include a processor 40, another, smaller group of logic circuits, or other control element that has been dedicated for use in conjunction with camera 34, is programmed, as known in the art, to process signals that represent images that have been "viewed" by camera 34 and respond to such signals.

A self-contained machine vision system available from a commercial vendor of such equipment may be employed as machine vision system 20. Examples of such machine vision systems and their various features are described, without limitation, in U.S. Pat. Nos. 4,526,646; 4,543,659; 4,736,437; 4,899,921; 5,059,559; 5,113,565; 5,145,099; 5,238,174; 5,463,227; 5,288,698; 5,471,310; 5,506,684; 5,516,023; 5,516,026; and 5,644,245. The disclosure of each of the immediately foregoing patents is hereby incorporated herein in its entirety by this reference. Such systems are available, for example, from Cognex Corporation of Natick, Mass. As an example, and not to limit the scope of the present invention, the apparatus of the Cognex BGA Inspection Package™ or the SMD Placement Guidance Package™ may be adapted for use in a programmable material consolidation system 10 that incorporates teachings of the present invention, although it is currently believed that the MVS-8000™ product family and the Checkpoint® product line, the latter employed in combination with Cognex PatMax™ software, may be especially suitable for use in the present invention.

Figure 2B:
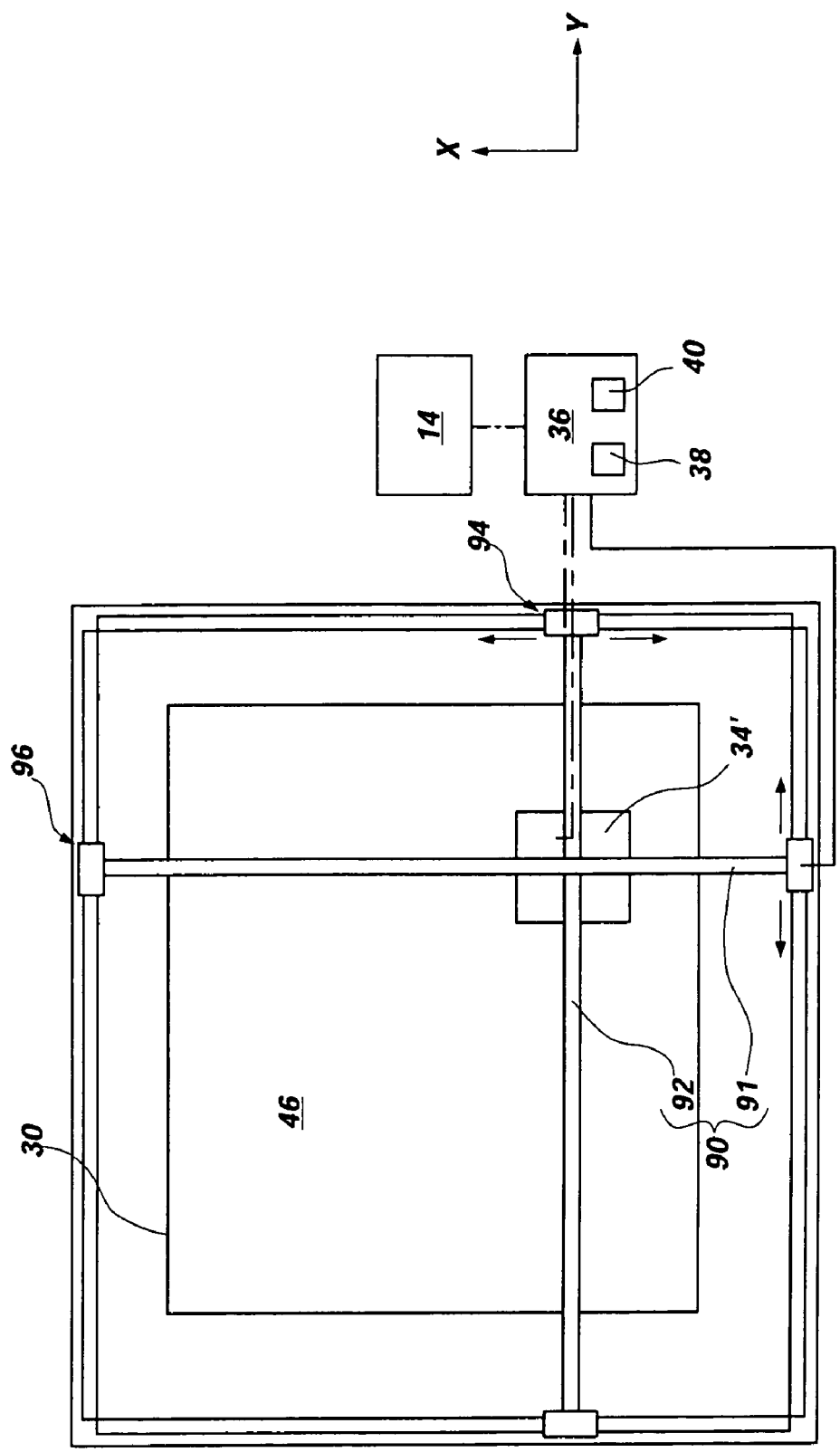
FIG. 2B is a schematic of another exemplary machine vision system having a scan element to position a camera over selected portions of a substrate.

Referring to FIG. 2B, in another exemplary embodiment, a camera 34' may be mounted on a scan element 90 operably coupled to and controlled by computer 36. The scan element 90 enables movement of the camera 34' over a substantial portion of the surface 46 of the substrate 30. Thus, the camera 34' may be moved independent of the dispense element 16 so that it does not interfere with the dispense element 16 during operation thereof.

Due to the close proximity of camera 34' to surface 46, the field of vision of camera 34' is relatively small. In order to enable camera 34' to view a larger area of surface 46 than that which is "covered" by, or located within, the field of vision of camera 34', a scan element 90 of a known type is configured to traverse camera 34' over at least part of the area of surface 46. Scan element 90 is also useful for moving camera 34' out of the path of any selectively consolidating energy being directed toward surface 46 from the consolidator 18 or any flowable material 28 being dispensed by the dispense element 16 on or over the surface 46. By way of example only, scan element 90 may comprise an X-Y plotter or scanner of a known type. Generally, an X-Y plotter or scanner includes an x-axis element 91 and a y-axis element 92 that intersect one another. As depicted, camera 34' is carried by both x-axis element 91 and y-axis element 92 and, thus, is positioned at or near the location where x-axis element 91 and y-axis element 92 intersect one another.

X-axis element 91 and y-axis element 92 are both configured to move relative to and, thus, to position camera 34 at a plurality of locations over the substrate 30. Movement of x-axis element 91 is effected by an actuator 96 (e.g., a stepper motor and actuation system, such as a gear or wheel that moves x-axis element 91 along a track) that has been operably coupled thereto, with actuator 96 being configured to cause x-axis element 91 to move laterally (i.e., perpendicular to the length thereof) along a y-axis. Y-axis element 92 is operatively coupled to an actuator 94, which is configured to cause y-axis element 92 to move laterally along an x-axis. Actuators 94 and 96 may be configured to move their respective x-axis element 91 and y-axis element 92 in a substantially continuous fashion or in an incremental fashion. Movement of actuators 94 and 96 may be controlled by computer 36.

Figure 2C:
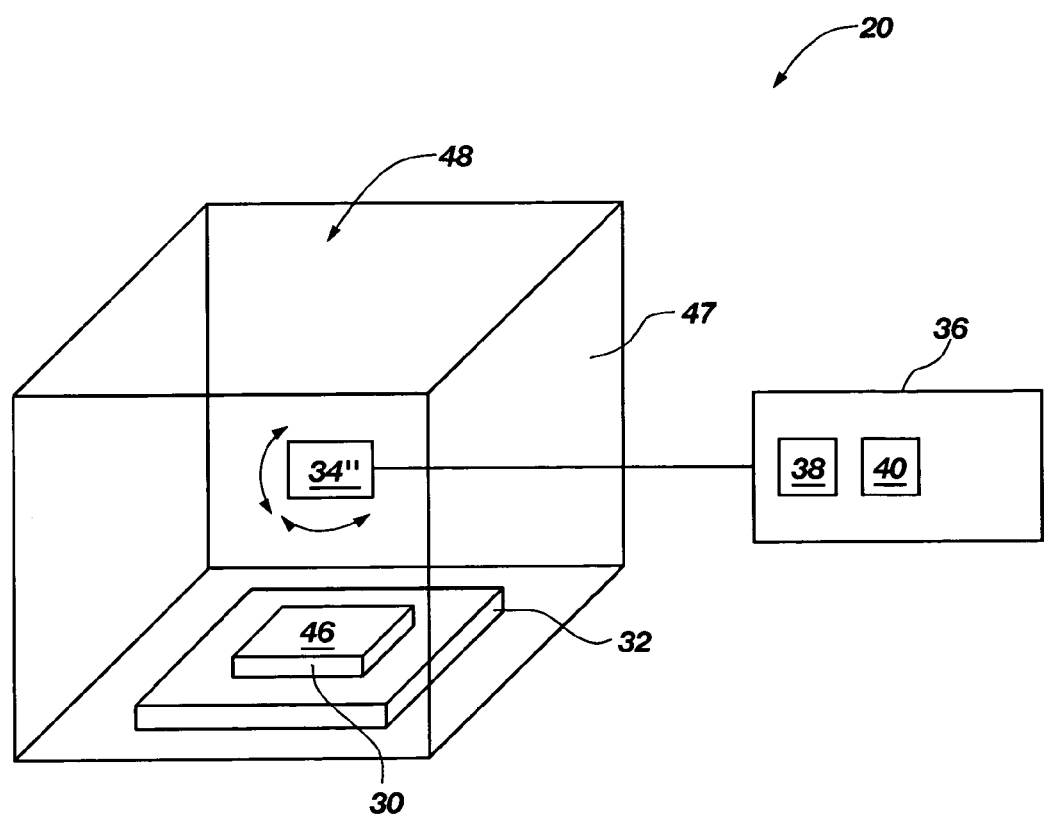
FIG. 2C is a schematic diagram of yet another exemplary machine vision system that includes a camera secured to the inside of the housing of the programmable material consolidation system of FIG. 1.

FIG. 2C shows another exemplary embodiment of machine vision system 20 that includes a locationally stationary camera 34". The camera 34" may be mounted or otherwise secured in a fixed position relative to surface 46 and may be maintained in a fixed position relative to the housing 48. In FIG. 2C, the camera 34" is shown fixed to the inside wall 47 of the housing 48 that encloses at least the dispense element 16 and associated nozzles 26. The camera 34" is mounted in a position so that it does not interfere with the operation and movement of the dispense element 16. As with the camera 34 and 34', the camera 34" is operably coupled to computer 36 having board 38 and at least one processor 40.

Like camera 34 and 34', which are described with reference to FIGS. 2A and 2B, camera 34" may comprise a CCD camera, a CMOS camera, or any other suitable type of camera. As camera 34" is positioned farther away from a substrate 30 to be viewed, the camera 34" may have an effectively larger field of vision than camera 34. Of course, suitable optical and/or digital magnification technology may be associated with camera 34" to provide the desired level of resolution. Further, although camera 34" may be locationally stationary, a suitable gimbals structure with rotational actuators may be employed to point camera 34" at a specific location in the field of exposure with little actual rotational movement. Thus, camera 34" may be used for both broad, or "macro," vision and viewing and inspection of miniature features.

The operation of the programmable material consolidation system 10 will be better understood by reference to the specific examples illustrated in FIGS. 3A and 3B and FIGS. 4A–4C. The programmable material consolidation system 10 of the present invention may be employed to fabricate a variety of structures on semiconductor substrates. For example, the programmable material consolidation system 10 may be used to fabricate support structures or mask elements in selected positions on a semiconductor substrate, wherein the selected positions are accurately located by the machine vision system 20 of the present invention.

Figure 3A:
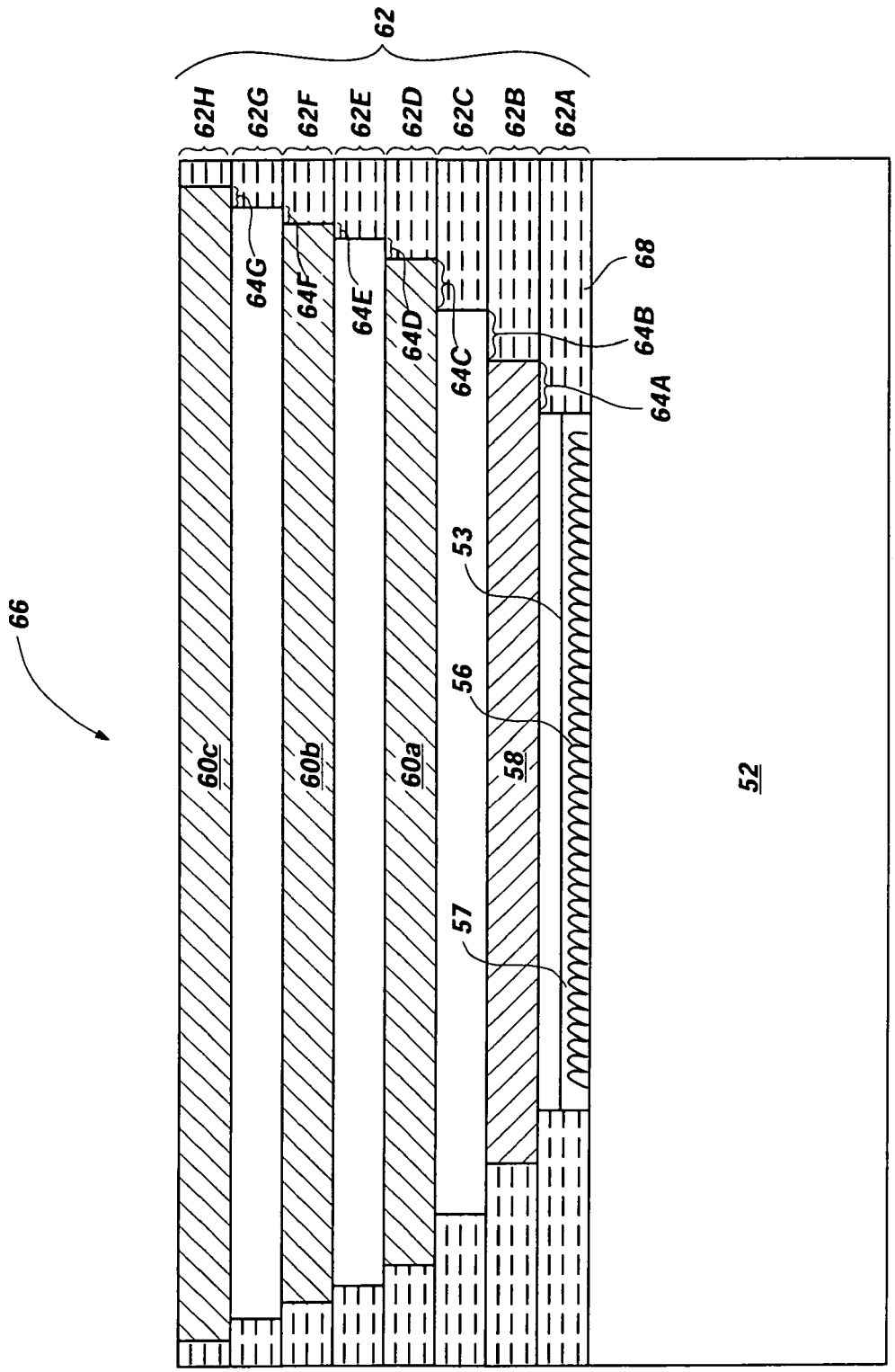
FIG. 3A is a sectional view of a support structure for supporting an infrared (IR) filter and a plurality of lenses of an optically interactive semiconductor device.
Figure 3B:
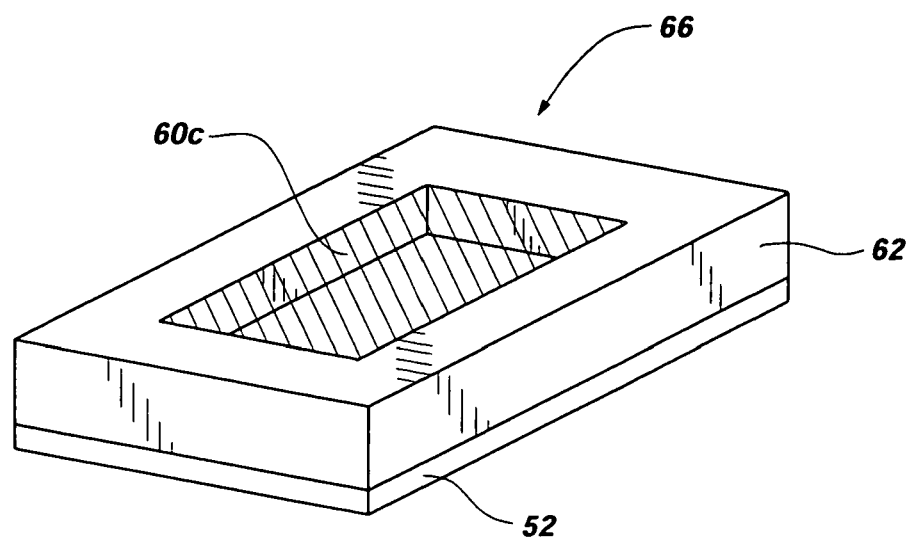
FIG. 3B is a perspective view of the support structure shown in FIG. 4A.

With reference to FIGS. 3A and 3B, in order to 3-D print support structure 62 on semiconductor substrate 52, corresponding data from the .stl files, which comprise a 3-D CAD model, stored in memory associated with process controller 14 are processed by the process controller 14. The data, which mathematically represents the support structure 62 to be fabricated, may be divided into subsets, each subset representing a layer 68, or "slice," of the object. The division of data may be effected by mathematically sectioning the 3-D CAD model into at least one layer 68, a single layer or a "stack" of such layers 68 representing the support structure 62. Each slice may be, for example, about 16 µm thick or any other desirable thickness. As used herein, the term "layer" or "slice" is not limiting as to any specific x- and y-plane dimension or z-plane thickness, and layers or slices may be extremely minute and not necessarily fully mutually superimposed, as it is contemplated that flowable materials 28 may be applied in extremely small quantities and substantially instantaneously cured to at least a semisolid state so that, at least for small distances, structures may be cantilevered.

Again referring to FIG. 3A, a sectional view of an optically interactive semiconductor device 66 is shown. A support structure 62 is depicted that supports a plurality of lenses 60a–60c and an infrared (IR) filter 58. Semiconductor substrate 52 includes at least one array 56 of optically interactive semiconductor devices such as, for example, CCD image sensors or CMOS image sensors on its active surface 53. The semiconductor substrate 52 may also be a bulk substrate comprised of a plurality of semiconductor dice locations, each containing an array 56 of optically interactive semiconductor devices. Each array 56 of optically interactive semiconductor devices may be substantially surrounded along its periphery by the support structure 62 including ledges 64A–64G that support a plurality of lenses 60a–60c for focusing light onto the array 56 and an IR filter 58. As known in the art, the IR filter 58 and the plurality of lenses 60a–60c may be fixed to the support structure 62 using an adhesive. Support structure 62 may be formed from any of the aforementioned flowable materials 28. The array 56 of optically interactive semiconductor devices may also be covered with a protective layer 57 formed from an optically clear flowable material 28. One suitable optically clear flowable material 28 is the Objet FullCure S-705 photopolymer support material commercially available from Objet Geometries Ltd. of Rehovot, Israel. Although not shown in FIG. 3A, it should be understood that the semiconductor substrate 52 may include external conductive elements for electrically connecting semiconductor substrate 52 to other semiconductor devices or higher level packaging, such as a printed circuit board. FIG. 3B illustrates a perspective view of the optically interactive semiconductor device 66 having the support structure 62 disposed on semiconductor substrate 52.

The package for the optically interactive semiconductor device 66 may be fabricated using the programmable material consolidation system 10 of the present invention. The semiconductor substrate 52 is provided on the support 32. The camera 34 of the machine vision system 20 locates the desired location adjacent the periphery of the array 56 that flowable material 28 is to be deposited on the semiconductor substrate 52. The dispense element 16 selectively deposits a layer 68 of flowable material 28 at the desired location by movement of the dispense element 16 under control of the process controller 14 to partially form support structure element 62A followed by the consolidator 18 at least partially consolidating the layer 68 of flowable material 28. The support structure elements 62A–62H are formed by selectively depositing the flowable material 28 in desired locations layer 68 by layer 68 (shown by the dashed lines in FIG. 3A) followed by at least partially consolidating each layer 68 with the consolidator 18 before the deposition of another layer, until the complete support structure 62 is so formed. The protective layer 57 is formed in the same manner by building up the protective layer 57 using one or more superimposed layers. Prior to the deposition of each layer 68, the camera 34 of the machine vision system 20 may be used to verify that the deposited flowable material 28 was deposited in the desired location on semiconductor substrate 52 or a prior layer 68, or the camera 34 may be used to identify and precisely locate another position for the selective deposition of the flowable material 28. The camera 34 may also be used to perform the verification just after the deposition of the flowable material 28 is initiated. Also, it should be understood that the number of layers that are required to form support structure elements 62A–62H and the protective layer 57 depends upon the desired height of the support structure elements 62A–62H that comprise the support structure 62.

Figure 4A:
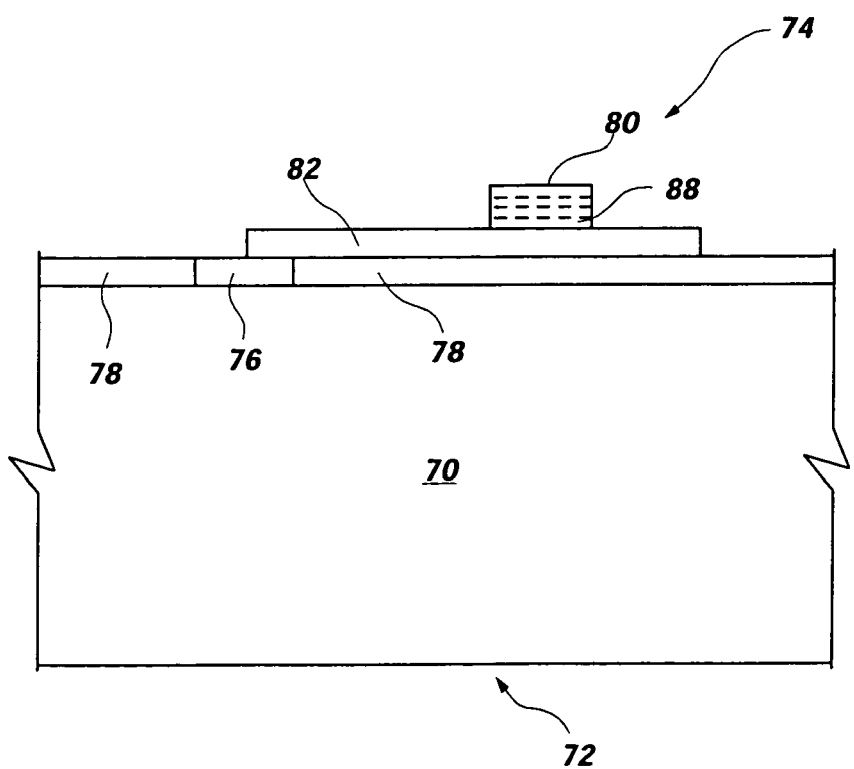
FIGS. 4A–4C illustrate a method of forming a mask element and a subsequent structure using the programmable material consolidation system of FIG. 1.
Figure 4B:
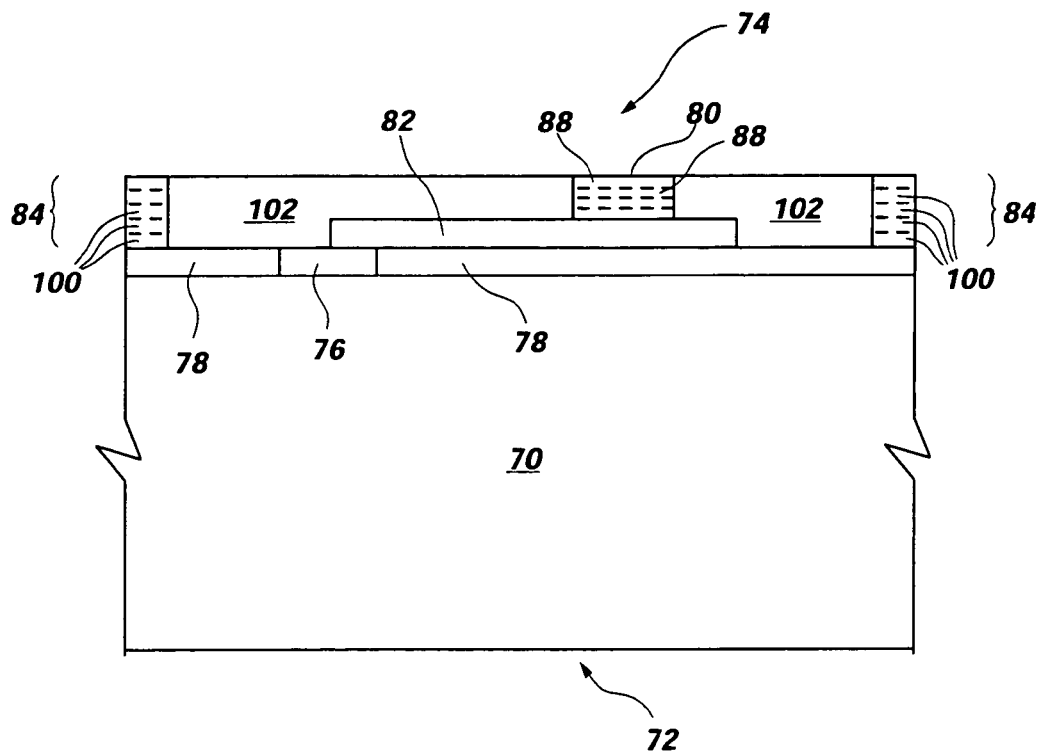
Figure 4C:
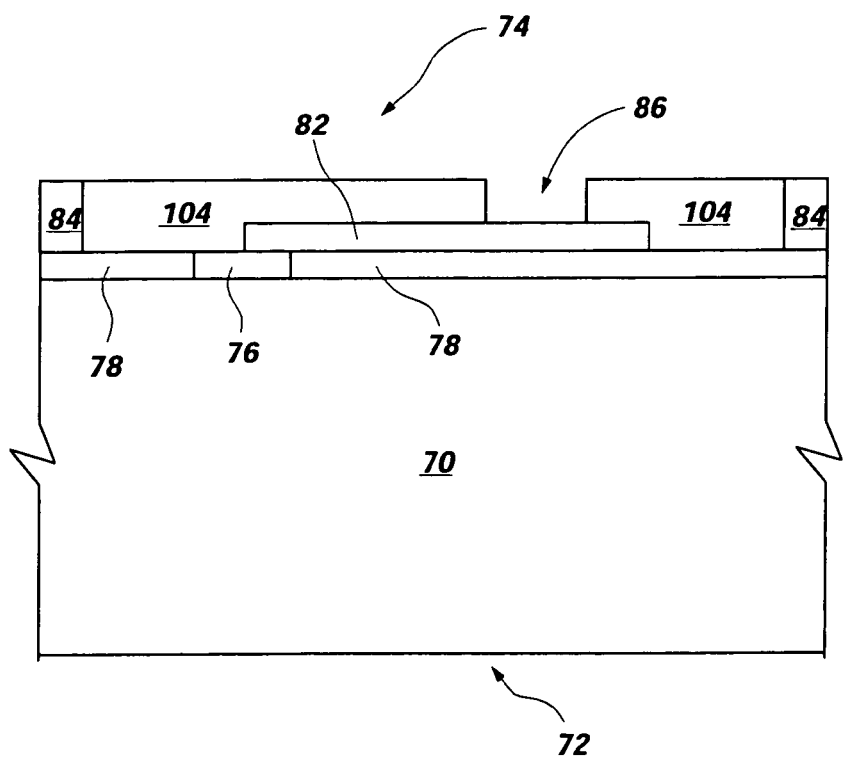

In another exemplary embodiment illustrated in FIGS. 4A–4C, the 3-D printing system of the present invention may also be used to form a plurality of removable/sacrificial mask elements. A simplified sectional drawing of a portion of a semiconductor substrate 70 having an active surface 74 and a back surface 72 is shown in FIG. 4A. An electrical contact 76 in the form of a bond pad is shown, which is in electrical communication with an integrated circuit formed within the semiconductor substrate 70 on active surface 74. A redistribution line 82 in the form of a conductive trace is depicted being in electrical communication with the electrical contact 76 and extending over dielectric layer 78 therefrom. Of course, in practice, semiconductor substrate 70 would bear a large plurality of electrical contacts 76, each of which having an associated redistribution line extending to another location over the active surface 74 for redistributing the I/O pattern of the integrated circuit for connection to external circuitry.

Again referring to FIG. 4A, a layer of flowable material 28 that is a sacrificial/removable consolidatable material, such as a water soluble photopolymer, may be selectively deposited from dispense element 16 on a portion of the redistribution line 82 to form mask element 80 using the programmable material consolidation system 10 of the present invention. Suitable water soluble photopolymers for forming the mask element 80 are disclosed in U.S. Patent Application Publication 2003/0207959 assigned to Objet Geometries Ltd., the disclosure of which is hereby incorporated herein in its entirety by this reference. As previously discussed, mask element 80 may be formed by the deposition of successive layers 88, with each layer 88 at least partially consolidated by consolidator 18 before the next layer 88 is deposited. Of course, the precise number of layers 88 used to form the mask element 80 depends upon the desired thickness of mask element 80. Furthermore, the machine vision system 20 may be used to locate the portion of the redistribution line 82 on which the mask element 80 is to be formed and to verify after forming layers of the mask element 80 that they have been formed in the desired location.

Referring to FIG. 4B, another, more permanent, consolidatable material may be selectively applied to the semiconductor substrate 70 having the mask element 80 thereon. The application of another consolidatable material may be effected employing the programmable material consolidation system 10 of the present invention to form a peripheral wall structure 84 from a consolidatable material. Following fabrication of peripheral wall structure 84, which may comprise a plurality of sequentially applied layers 100, semiconductor substrate 70 including the mask element 80 may be immersed in a bath of liquid photopolymerizable resin 102 such as is used in a stereolithography apparatus, for example, of the type disclosed in the aforementioned U.S. Pat. No. 6,537,482 to Farnworth, and then raised from the bath. The liquid photopolymerizable resin 102 is thus trapped within wall structure 84 to a level determined by the height of the wall structure 84. The liquid photopolymerizable resin 102 may then be floodlight-exposed to UV light or subjected to heat to effect a cure thereof. The dielectric layer 104 so formed surrounds the mask element 80 about its periphery with the mask element 80 exposed therethrough. If a liquid photopolymerizable resin 102 is employed as the consolidatable material to form peripheral wall structure 84, it may be at least partially consolidated by exposure to a suitable UV point source, such as a laser beam, that irradiates light in the UV wavelength. Suitable liquid photopolymerizable resins for use in practicing the present invention include, without limitation, ACCURA® SI 40 Hc and AR materials and CIBATOOL SL 5170 and SL 5210 resins for the SLA® 250/50HR and SLA® 500 systems, ACCURA® SI 40 Nᴅ material and CIBATOOL SL 5530 resin for the SLA® 5000 and 7000 systems, and CIBATOOL SL 7510 resin for the SLA® 7000 system. The ACCURA® materials are available from 3D Systems, Inc., of Valencia, Calif., while the CIBATOOL resins are available from Ciba Specialty Chemicals Inc. of Bezel, Switzerland.

Referring to FIG. 4C, the mask element 80 may be removed by subjecting it to a solvent, such as by immersing the semiconductor substrate 70 including the mask element 80 in water or another solvent suitable for dissolution of mask element 80 to selectively dissolve the mask element 80 into solution and remove the mask element 80. Thus, a plurality of apertures 86 may be formed in dielectric layer 104 at desired locations over respective redistribution lines 82 by removing the mask elements 80. As known in the art, solder may be deposited within the apertures 86 by stenciling or screening and then formed into conducted bumps by heat-induced reflow to provide discrete external electrical contacts for interconnecting with another semiconductor die or a higher level device. Thus, by employing the removable mask element 80 in combination with peripheral wall structure 84, apertures 86 may be formed without having to use expensive and time consuming photolithography or electron beam lithography systems. The exemplary embodiment disclosed in FIGS. 4A–4C is only one example of a type of structure that may be fabricated and with which the removable material may be used.

Although the foregoing description contains many specifics, these are not to be construed as limiting the scope of the present invention, but merely as providing certain exemplary embodiments. Similarly, other embodiments of the invention may be devised which do not depart from the spirit or scope of the present invention. The scope of the invention is, therefore, indicated and limited only by the appended claims and their legal equivalents, rather than by the foregoing description. All additions, deletions, and modifications to the invention, as disclosed herein, which fall within the meaning and scope of the claims are encompassed by the present invention.

What is claimed is:

1. A programmable material consolidation system comprising:
   a support element;
   at least one dispense element selectively movable in relation to the support element and configured to dispense a flowable material on or over the support element;
   a machine vision system; and
   at least one controller in communication with the at least one dispense element and the machine vision system and configured to:
      recognize at least one feature of or associated with the support element or at least one feature of a substrate located on the support element and viewed by the machine vision system; and
      cause the at least one dispense element to selectively dispense the flowable material to form a structure at a location over the support element in response to a position of the at least one feature.

2. The system of claim 1, wherein the machine vision system is configured and oriented to view at least a region of the support element.

3. The system of claim 1, wherein the at least one dispense element comprises a plurality of nozzles configured to dispense flowable material.

4. The system of claim 1, wherein the machine vision system includes a locationally stationary camera positioned to avoid mutual interference with the at least one dispense element.

5. The system of claim 4, wherein the locationally stationary camera includes a charge-coupled device or a complementary metal-oxide-semiconductor device.

6. The system of claim 4, wherein the machine vision system is configured to view at least a portion of the area over the support element.

7. The system of claim 4, wherein the machine vision system further includes at least one rotational element associated with the locationally stationary camera to facilitate orientation of the locationally stationary camera over a selected field of view in the area over the support element.

8. The system of claim 1, wherein the machine vision system further includes a camera secured to the at least one dispense element.

9. The system of claim 8, wherein the camera includes a charge-coupled device or a complementary metal-oxide-semiconductor device.

10. The system of claim 1, wherein the machine vision system is configured to provide signals to the at least one controller indicating at least one of a location, size and configuration of the at least one feature in the area over the support element.

11. The system of claim 10, wherein the at least one controller is configured to cause selective deposition of the flowable material by the at least one dispense element at precise locations responsive to a signal representative of at least one of a location, size and configuration of the at least one feature viewed by the machine vision system.

12. The system of claim 1, wherein the at least one feature comprises at least one fiducial mark on a structure associated with the support element for providing a reference point for the machine vision system.

13. The system of claim 1, wherein the machine vision system includes a movable camera that is movable independent from the at least one dispense element, the movable camera being movable over at least a portion of the support element.

14. The system of claim 13, wherein the movable camera includes a charge-coupled device or a complementary metal-oxide-semiconductor device.

15. A programmable material consolidation system comprising:
   a support element;
   at least one dispense element selectively movable in relation to the support element and configured to dispense a flowable material on or over the support element;
   a machine vision system secured to the at least one dispense element; and
   at least one controller in communication with the at least one dispense element and the machine vision system.

16. The system of claim 15, wherein the machine vision system is configured and oriented to view at least a region of the support element.

17. The system of claim 15, wherein the at least one dispense element comprises a plurality of nozzles configured to dispense flowable material.

18. The system of claim 15, wherein the machine vision system is configured to view at least a portion of the area over the support element.

19. The system of claim 15, wherein the machine vision system comprises a camera.

20. The system of claim 19, wherein the camera comprises a charge-coupled device or a complementary metal-oxide-semiconductor device.

21. The system of claim 19, wherein the machine vision system further includes at least one rotational element associated with the camera to facilitate orientation of the locationally stationary camera over a selected field of view in the area over the support element.

22. The system of claim 15, wherein the at least one controller is programmed to recognize at least one feature of the support element or of a substrate located on the support element and viewed by the machine vision system.

23. The system of claim 22, wherein the machine vision system is configured to provide signals to the at least one controller indicating at least one of a location, size and configuration of the at least one feature.

24. The system of claim 23, wherein the at least one controller is configured to cause the selected deposition of the flowable material by the at least one dispense element at precise locations responsive to a signal representative of at least one of a location, size and configuration of the at least one feature viewed by the machine vision system.

25. The system of claim 22, wherein the at least one feature comprises at least one fiducial mark on a structure associated with the support element for providing a reference point for the machine vision system.

26. A programmable material consolidation system comprising:
- a support element;
- at least one dispense element selectively movable in relation to the support element and configured to dispense a flowable material on or over the support element;
- a machine vision system;
- at least one controller in communication with the at least one dispense element and the machine vision system; and
- a consolidation element configured to direct consolidating energy to a dispense location of the flowable material.

27. The system of claim 26, wherein the machine vision system comprises a camera.

28. The system of claim 27, wherein the camera is a locationally stationary camera positioned to avoid mutual interference with the at least one dispense element.

29. The system of claim 28, wherein the machine vision system further includes at least one rotational element associated with the locationally stationary camera to facilitate orientation of the locationally stationary camera over a selected field of view in the area over the support element.

30. The system of claim 26, wherein the camera comprises a movable camera that is movable independent from the at least one dispense element and over at least a portion of the support element.

31. The system of claim 26, wherein the at least one controller is programmed to recognize at least one feature of the support element or of a substrate located on the support element and viewed by the machine vision system.

32. The system of claim 31, wherein the machine vision system is configured to provide signals to the at least one controller indicating at least one of a location, size and configuration of the at least one feature.

33. The system of claim 32, wherein the at least one controller is configured to cause the selected deposition of the flowable material by the at least one dispense element at precise locations responsive to a signal representative of at least one of a location, size and configuration of the at least one feature viewed by the machine vision system.

34. The system of claim 31, wherein the at least one feature comprises at least one fiducial mark on a structure associated with the support element for providing a reference point for the machine vision system.

* * * * *